United States Patent [19]

Kuhn

[11] Patent Number: 5,761,054
[45] Date of Patent: Jun. 2, 1998

[54] INTEGRATED CIRCUIT ASSEMBLY PREVENTING INTRUSIONS INTO ELECTRONIC CIRCUITRY

[75] Inventor: Harry A. Kuhn, Phoenix, Ariz.

[73] Assignee: Intel Corporation, Santa Clara, Calif.

[21] Appl. No.: 917,988

[22] Filed: Aug. 25, 1997

Related U.S. Application Data

[63] Continuation of Ser. No. 412,159, Mar. 28, 1995, abandoned.

[51] Int. Cl.⁶ .................... H05K 9/00; H05K 1/00
[52] U.S. Cl. .......... 361/818; 361/749; 361/751; 174/52.1; 174/35 R; 174/51
[58] Field of Search .................. 174/35 R, 51, 174/52.1-52.4; 257/787; 361/683, 749-751, 816, 818; 29/855, 828-832

[56] References Cited

U.S. PATENT DOCUMENTS

| | | | |
|---|---|---|---|
| 5,166,772 | 11/1992 | Soldner et al. | 174/35 R |
| 5,336,931 | 8/1994 | Juskey et al. | 257/787 |
| 5,360,941 | 11/1994 | Roes | 174/35 R |
| 5,386,342 | 1/1995 | Rostoker | 361/749 |
| 5,444,387 | 8/1995 | Van Loan et al. | 324/754 |
| 5,478,006 | 12/1995 | Taguchi | 228/180.21 |
| 5,491,612 | 2/1996 | Nicewarner, Jr. | 361/760 |
| 5,499,161 | 3/1996 | Hosseinzadeh et al. | 361/749 |

*Primary Examiner*—Bot L. Ledynh
*Attorney, Agent, or Firm*—Blakely, Sokoloff, Taylor & Zafman

[57] ABSTRACT

An integrated circuit package which has a flexible circuit that covers an integrated circuit. The flexible circuit contains a conductive line which prevents a probe from accessing the integrated circuit. The conductive line of the flexible circuit can be attached to the power lines, synchronization line, memory erase line, or any other line that will disable, erase or otherwise prevent access to the integrated circuit if the flexible circuit conductive line is broken. The integrated circuit can be mounted to a printed circuit board. The printed circuit board, integrated circuit and flexible circuit can all be enclosed within the package.

15 Claims, 2 Drawing Sheets

INTEGRATED CIRCUIT ASSEMBLY PREVENTING INTRUSIONS INTO ELECTRONIC CIRCUITRY

This is a Continuation Application of application Ser. No. 08/412,159, filed Mar. 28, 1995, now abandoned.

BACKGROUND OF THE INVENTION

1. Field of the Invention

The present invention relates to an integrated circuit package which prevents the interrogation of an integrated circuit.

2. Description of Related Art

Integrated circuits are typically housed within a plastic or ceramic package that is soldered to a printed circuit board. The integrated circuit may contain information such as microcode that is proprietary to the producer of the chip. The downloading of such information can be valuable to a competitor that may want to duplicate the circuit. Additionally, the integrated circuit may contain information proprietary to the end user, such as credit and banking information.

The information on a integrated circuit can be accessed by exposing the circuit die to a probe(s). The die can be exposed to the probe by simply removing the package lid or etching away the package material. It would be desirable to provide an integrated circuit package that would prevent the interrogation of an integrated circuit by an external probe.

SUMMARY OF THE INVENTION

The present invention is an integrated circuit package which has a flexible circuit that covers an integrated circuit. The flexible circuit contains a conductive line, which prevents a probe from accessing the integrated circuit. The conductive line of the flexible circuit can be attached to the power lines, synchronization line, memory erase line, or any other line that will disable, erase or otherwise prevent access to the integrated circuit if the flexible circuit conductive line is broken.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
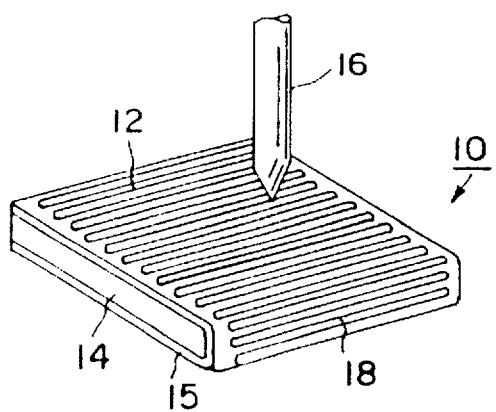
FIG. 1 is a perspective view of an integrated circuit assembly of the present invention.
Figure 2:
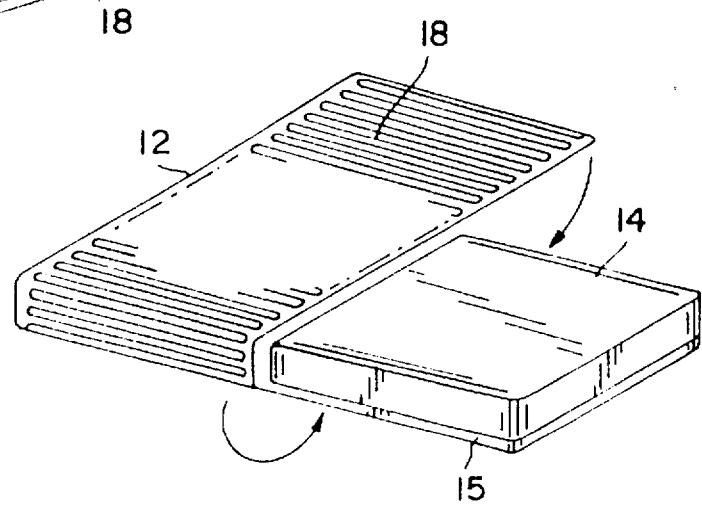
FIG. 2 is an exploded view of the integrated circuit package.

Referring to the drawings more particularly by reference numbers, FIGS. 1 and 2 show an integrated circuit assembly 10 of the present invention. The assembly 10 includes a flexible circuit 12 that is wrapped around an integrated circuit die 14 that is mounted to a substrate 15. The substrate 15 may have a plurality of contacts (not shown) that allow the substrate 15 and integrated circuit 14 to be connected to an external device. The integrated circuit 14 typically has a plurality of terminals and bonding pads located throughout the circuit. The signals and corresponding information within the integrated circuit 14 can be sensed and downloaded by an external probe 16 that is placed into contact with the pads. The flexible circuit 12 prevents the probe 16 from coming into contact with the terminals, thereby precluding access to the information within the integrated circuit 14. The integrated circuit 14 may be covered with an encapsulant (not shown) located between the outer surface of the circuit 14 and the undersurface of the flexible circuit 12. The encapsulant may further protect the surface of the circuit 14.

The flexible circuit 12 can be constructed to have a conductive line 18 routed throughout the circuit 12. The conductive line 18 can be an etched trace that is attached to an outer layer of dielectric polyimide material. The conductive line 18 can be routed in a serpentine manner to form a continuous single trace across the flexible circuit 12. The conductive trace 18 may be spaced so that any attempt to place a probe onto the integrated circuit 14 will result in the probe making electrical contact with the conductive trace, thereby shielding access to the terminals and pads of the circuit 14.

Figure 3:
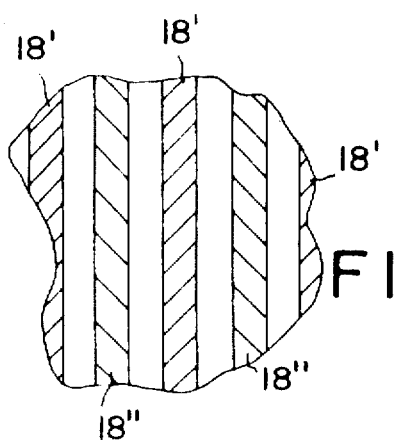
FIG. 3 is an enlarged view of a flexible circuit that is wrapped around an integrated circuit.

As shown in FIG. 3, to increase the spacing of the conductive traces 18 and decrease the cost of producing the flexible circuit 12, the flexible circuit 12 may have two layers wherein the conductive traces 18' of the first layer are located within the spaces between the conductive traces 18" of the second layer. The flexible circuit 12 may be bonded to the integrated circuit 14 with an adhesive that stronger than the material of the flexible circuit 12, or the integrated circuit 14, so that any attempt to unwrap the flexible circuit 12 from the die 14 will result in the destruction of the integrated circuit 14, or the separation of the polyimide and the conductive trace 18 so that the conductive trace 18 remains attached to the die 14.

Figure 4:
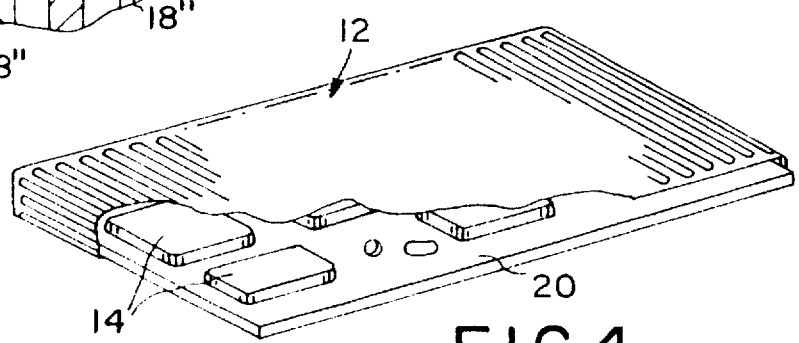
FIG. 4 is a perspective view of an integrated circuit and flexible circuit attached to a printed circuit board.

As shown in FIG. 4, one or more integrated circuits 12 can be mounted to a printed circuit board 20. The printed circuit board 20 may contain wire routing to interconnect the integrated circuits 14. The flexible circuit 12 can be wrapped around the integrated circuits 14 to protect the same. Additionally, the flexible circuit 12 can also be wrapped around the printed circuit board 20 to prevent access to the routing of the board 20. As an alternate embodiment, a portion of the flexible circuit 12 may be reinforced with a rigid substrate and mounted to the integrated circuits 14. The flexible circuit 12 may have additional conductive traces to provide routing between the integrated circuits 14.

Figure 5:
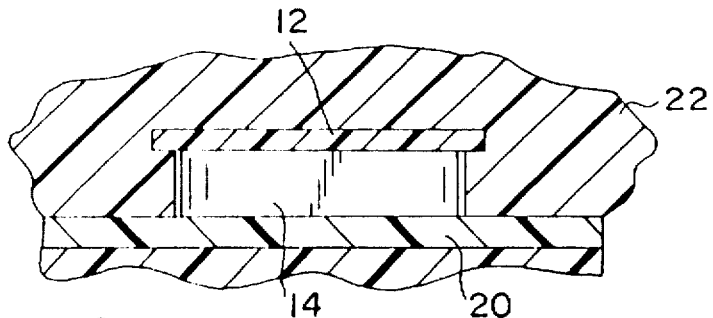
FIG. 5 is a cross-sectional view showing the integrated circuit, flexible circuit and printed circuit board within a package.

As shown in FIG. 5, the integrated circuits 14, flexible circuit 12 and printed circuit board 20 may be enclosed within a package 22. The package 22 may be formed by a plastic injection molding process. The integrated circuit 14 may be connected to external package leads (not shown) by vias, a lead frame, or other package interconnect known in the art. The flexible circuit 12 prevents access to the integrated circuits even if the circuits are removed from, or exposed within, the package.

Figure 6:
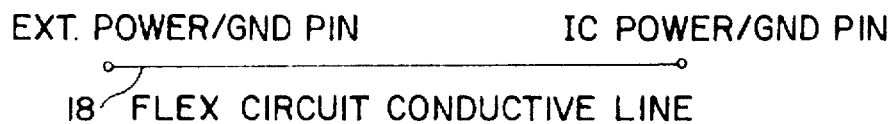
FIG. 6 is a schematic of a flexible circuit line that functions as a fuse for an integrated circuit.

FIG. 6 shows the conductive line 18 of the flexible circuit 12 connected to a pair of power pins of the integrated circuit 14. The conductive line 18 can function as a fuse, so that if the line is opened, power cannot be provided to the integrated circuit 14. Therefore if an intruder attempts to access the die 14 by cutting through the flexible circuit 12, the severing of the conductive line 18 will create an open circuit that will prevent operation of the integrated circuit 14.

Figure 7A:
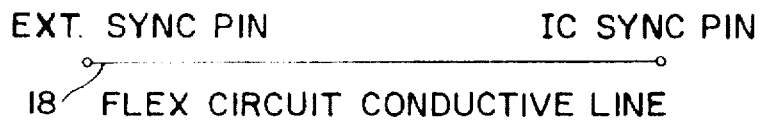
FIGS. 7a-c are schematics showing the flexible circuit line connected to a sync line, a memory erase line and a sensing line of an integrated circuit.
Figure 7B:
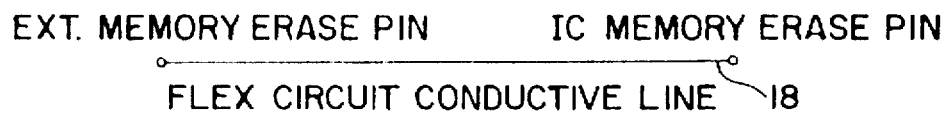
Figure 7C:
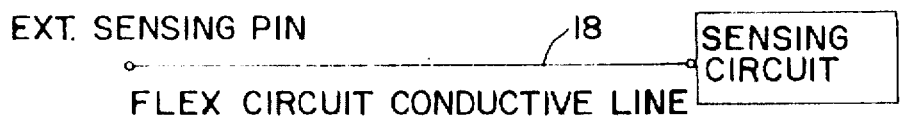

As shown in FIG. 7, the conductive line 18 may also be connected to other pins of the integrated circuit 14 that will render the integrated circuit inoperable or inaccessible if the conductive line 18 is broken. For example, the conductive line 10 of the flexible circuit 12 may provide the synchronization (sync) clock signal to the integrated circuit. The clock synchronization signal may be an unknown value, so that when the conductive line is broken, an intruder may not provide a valid sync signal to the integrated circuit to operate the same. If the integrated circuit is a memory device, the conductive line 18 can be connected to the erase pin, so that an open line 18 will erase the contents of the memory device. As another alternative, the conductive line 18 may be connected to a sensing circuit which senses when the line 18 is broken or is being probed and disables the integrated circuit 14, accordingly. The flexible circuit 12 therefore prevents access to the integrated circuit die and/or the information contained within the integrated circuit.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit assembly which prevents an interrogation of an integrated circuit within a package, comprising:

an integrated circuit that has an operable pin; and, a flexible circuit that covers and prevents a probe from accessing said integrated circuit, wherein said flexible circuit has a conductive line connected to said operable pin of said integrated circuit so that said integrated circuit is inoperative when said conductive line is broken.

2. The assembly as recited in claim 1, wherein said conductive line of said flexible circuit is connected to a clock synchronization pin of said integrated circuit.

3. The assembly as recited in claim 1, wherein said conductive line of said flexible circuit is connected to a memory erase pin of said integrated circuit.

4. The assembly as recited in claim 1, wherein said conductive line of said flexible circuit is connected to a sensing circuit of said integrated circuit which disables said integrated circuit when said conductive line is opened.

5. The assembly as recited in claim 1, further comprising a printed circuit board that is attached to said integrated circuit.

6. The assembly as recited in claim 1, further comprising of packaging that encloses said integrated circuit and said flexible circuit.

7. The assembly as recited in claim 1, wherein said conductive line is routed in a serpentine configuration.

8. The assembly as recited in claim 1, wherein said flexible circuit has conductive line portions separated by a non-conductive space within a first layer of said flexible circuit, and a conductive line portion located within a second layer of said flexible circuit in-line with said non-conductive space of said first layer.

9. An integrated circuit package, comprising:

a printed circuit board;

an integrated circuit that is mounted to said printed circuit board, said integrated circuit has an operable pin;

a flexible circuit that covers and prevents a probe from accessing said integrated circuit, said flexible circuit has a conductive line connected to said operable pin of said integrated circuit so that said integrated circuit is inoperative when said conductive line is broken; and, packaging that encloses said printed circuit board, said integrated circuit and said flexible circuit.

10. The package as recited in claim 9, further comprising a lead frame connected to said integrated circuit.

11. The package as recited in claim 9, wherein said conductive line of said flexible circuit is connected to a clock synchronization pin of said integrated circuit.

12. The package as recited in claim 9, wherein said conductive line of said flexible circuit is connected to an memory erase pin of said integrated circuit.

13. The package as recited in claim 9, wherein said conductive line of said flexible circuit is connected to a sensing circuit of said integrated circuit which disables said integrated circuit when said conductive line is opened.

14. The package as recited in claim 9, wherein said conductive line is routed in a serpentine configuration.

15. The package as recited in claim 9, wherein said flexible circuit has conductive line portions separated by a non-conductive space within a first layer of said flexible circuit, and a conductive line portion located within a second layer of said flexible circuit in-line with said non-conductive space of said first layer.

* * * * *